United States Patent [19]

Moncorge

[11] Patent Number: 5,552,978
[45] Date of Patent: Sep. 3, 1996

[54] DEVICE FOR SUPPLYING A VOLTAGE TO AN ELECTRONIC CIRCUIT, IN PARTICULAR AN ELECTRONIC CIRCUIT ASSOCIATED WITH A CURRENT SENSOR DISPOSED ON AN ELECTRICAL LINE

[75] Inventor: Jean-Paul Moncorge, Vaulx en Velin, France

[73] Assignee: Gec Alsthom T & D SA, Paris, France

[21] Appl. No.: 257,828

[22] Filed: Jun. 9, 1994

[30] Foreign Application Priority Data

Jun. 10, 1993 [FR] France .................................. 93 06992

[51] Int. Cl.$^6$ .................................................. H02M 7/04
[52] U.S. Cl. ........................... 363/89; 323/902; 323/223; 323/271; 323/299; 361/111
[58] Field of Search ........................ 307/99, 100; 363/77, 363/81, 86, 89; 323/902, 303, 299, 223, 271; 361/111

[56] References Cited

U.S. PATENT DOCUMENTS

| | | | |
|---|---|---|---|
| 3,434,011 | 8/1966 | Zocholl | 317/33 |
| 3,733,517 | 5/1973 | Wilson | 317/180 |
| 3,777,049 | 11/1973 | Piccione | 324/51 |
| 5,345,145 | 9/1994 | Zeng et al. | 315/209 R |

Primary Examiner—Peter S. Wong
Assistant Examiner—Shawn Riley
Attorney, Agent, or Firm—Sughrue, Mion, Zinn, Macpeak & Seas

[57] ABSTRACT

A device for supplying a power supply voltage to an electronic circuit, in particular to an electronic circuit associated with a current sensor for measuring the electrical current in a high-tension line, comprises a current transformer having a primary circuit and a secondary circuit, a rectifier bridge shunting the secondary circuit and output terminals of the rectifier bridge, a first capacitor in parallel with a first resistor across which said power supply voltage is obtained, and a first switch disposed between the output terminals of the rectifier bridge. It includes between the output terminals of the rectifier bridge a branch comprising in series a second capacitor, a second switch and a second resistor. The first switch is controlled by a first threshold detector shunting the second capacitor. The second switch is controlled by a second threshold detector shunting the first capacitor. The first and second threshold detectors respectively close the first and second switches when predetermined first and second thresholds are respectively reached.

2 Claims, 4 Drawing Sheets

5,552,978

DEVICE FOR SUPPLYING A VOLTAGE TO AN ELECTRONIC CIRCUIT, IN PARTICULAR AN ELECTRONIC CIRCUIT ASSOCIATED WITH A CURRENT SENSOR DISPOSED ON AN ELECTRICAL LINE

BACKGROUND OF THE INVENTION

1. Field of the Invention

The present invention concerns the supply of a voltage to an electronic circuit and in particular the supply of electrical power to the electronic circuit associated with a current sensor adapted to measure the electric current flowing in a high-tension line.

2. Description of the Prior Art

A current sensor usually comprises a shunt or a torus or a Rogowski coil; the current sensor is associated with an electronic circuit producing from the analog information supplied by the sensor a (preferably digital) signal from which the current can be deduced; this signal is applied to a photodiode so that the information can be conveyed to the ground along an optical fiber. The sensor and the associated electronic circuit are at the high-tension potential; the optical fiber can provide insulation between the high-tension and the ground.

The problem arises of supplying power to the aforementioned electronic circuit; there is no question of transmitting the necessary power from the ground by means of a conventional transformer because of the high level of insulation required, which would cancel out the advantage of the envisaged measuring device.

It is therefore necessary to supply the device with power from the line current, for example using a torus provided with a magnetic core with a secondary winding supplying the necessary power supply current.

This arrangement requires a solution to a number of technical problems and an object of the present invention is to provide these solutions.

A first problem arises on the appearance of the current, especially in the presence of aperiodic components of the current: several milliseconds are required to achieve steady state conditions under which power can be supplied. The problem to be solved is that of supplying power during these few milliseconds preceding steady state conditions.

A second problem arises when high overloads occur, due to short-circuit currents caused by a fault on the line, for example: the power supply must therefore be able to withstand temporary overloads.

SUMMARY OF THE INVENTION

The invention consists in a device for supplying a power supply voltage to an electronic circuit, in particular to an electronic circuit associated with a current sensor for measuring the electrical current in a high-tension line, said device comprising a current transformer having a primary circuit and a secondary circuit, a rectifier bridge shunting the secondary circuit and output terminals of the rectifier bridge, a first capacitor in parallel with a first resistor across which said power supply voltage is obtained, a first switch being disposed between the output terminals of the rectifier bridge, said device comprising between the output terminals of the rectifier bridge a branch comprising in series a second capacitor, a second switch and a second resistor, the first switch being controlled by a first threshold detector shunting the second capacitor, the second switch being controlled by a second threshold detector shunting the first capacitor, the first and second threshold detectors respectively closing the first and second switches when predetermined first and second thresholds are respectively reached.

The current transformer comprises two secondary windings with different numbers of turns and connected in series to the rectifier bridge connected to the rectifier bridge through a controlled third switch.

The third switch is controlled by a third sensor receiving the current flowing through the secondary winding.

Alternatively, the third switch is controlled by said first threshold detector.

The device comprises, at the output of the rectifier bridge, a branch comprising in series a third capacitor in series with a fourth switch, said capacitor being connected to a power supply line receiving electrical power from the output of an opto-electronic converter receiving at its input luminous energy conducted from the ground by an optical fiber, said fourth switch being controlled by said third sensor.

The luminous energy in the optical fiber is sent in the form of pulses which are also used to constitute synchronization instructions addressed to said electronic circuit.

The invention will be better understood from the description of various embodiments of the invention given hereinafter with reference to the appended drawings.

DETAILED DESCRIPTION OF THE PREFERRED EMBODIMENT

Figure 1:
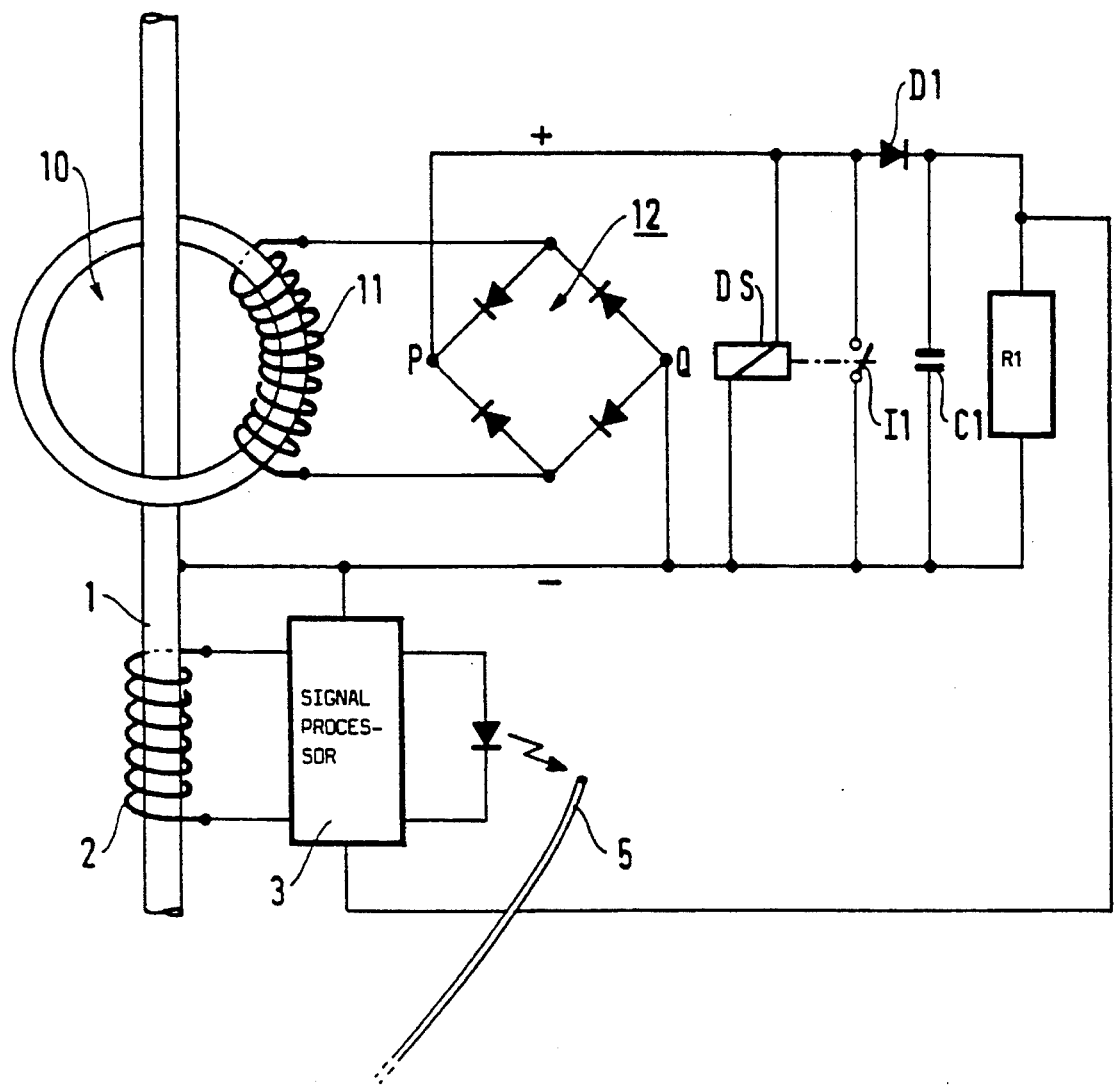
FIG. 1 is a circuit diagram of a line current measuring device and the prior art device for supplying power to its electronic circuit.

Referring to FIG. 1, an electrical line the current in which is to be measured includes a phase wire 1. The following description refers only to the components associated with one phase, on the understanding that for a three-phase line the other phases are provided with the same devices identically implemented.

The current measuring device comprises a sensor 2, for example a Rogowski coil, associated with an electronic circuit 3 processing the sensor output signal and supplying at its output a wanted signal sent to the ground by a photodiode 4 and an optical fiber 5. The current measuring device does not form any part of the invention and is not described here. A suitable reference document in this regard is Techniques de l'Ingénieur, "Transformateur amagnétique de courant, Tore de Rogowski, D 4 724-8.

In a manner that is known in itself the electronic circuit 3 is supplied with power from the line itself via a device comprising a current transformer comprising a torus 10 through which the phase wire 1 passes and the secondary circuit 11 of which feeds a rectifier bridge 12 which charges a capacitor C1 through a diode D1. When the voltage across the capacitor C1 reaches a given first threshold value V1 a threshold detector DS actuates an electronic switch I1 which short-circuits the current transformer 10. The diode D1 prevents the capacitor from discharging through the switch I1. The capacitor C1 discharges into a resistor R1 across which the power supply voltage U of the electronic circuit 3 is developed.

When the voltage across the capacitor C1 reaches a given second threshold value V2, less than V1, the threshold detector DS1 opens the switch I1 and the capacitor C1 is recharged. The same cycle repeats provided that the current output by the torus is greater than the current required by the load.

Figure 2:
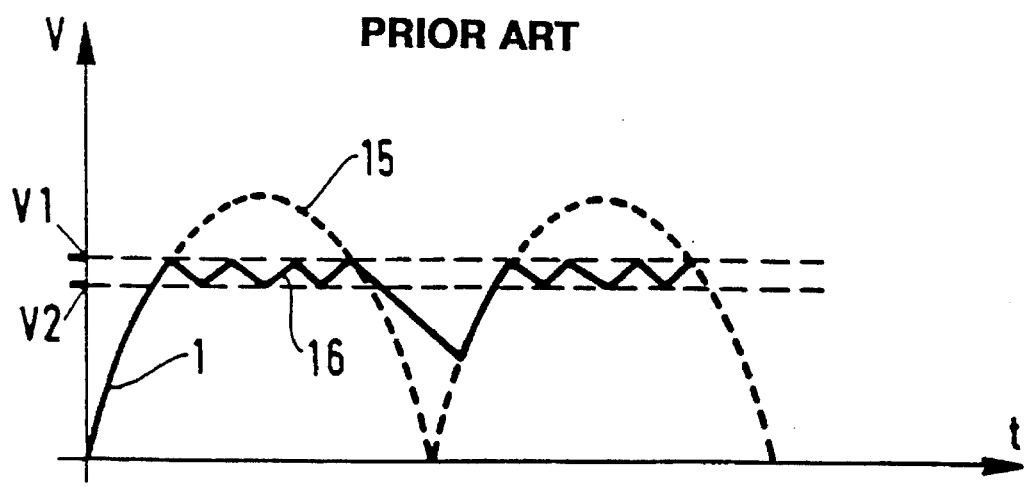
FIG. 2 is a diagram showing how the power supply device of FIG. 1 works when it comprises a low-value capacitor.
Figure 3:
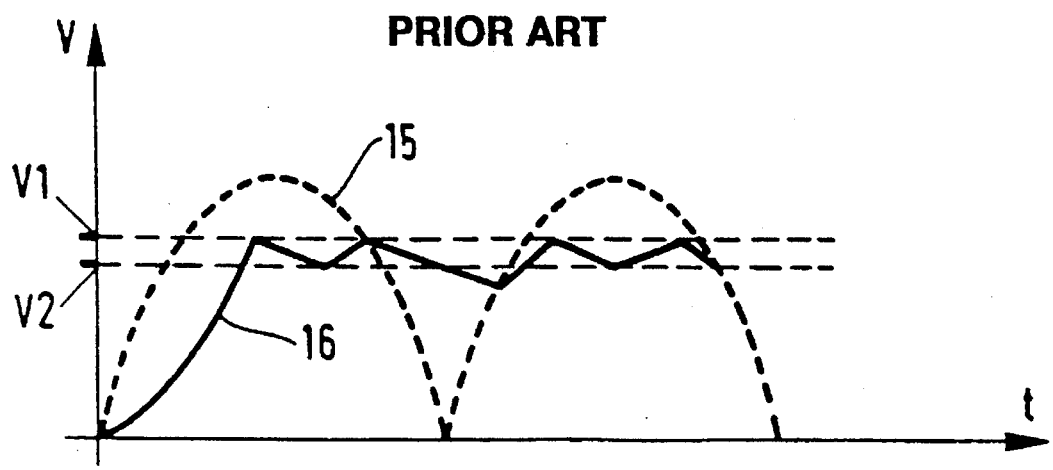
FIG. 3 is a diagram showing how the power supply device of FIG. 1 works when it comprises a high-value capacitor.

If the capacitor is a low-value capacitor a voltage trough appears periodically, as shown in FIG. 2. Curve 15 represents the output voltage of the rectifier bridge 12 and curve 16 the voltage across the capacitor C1. Note that the curve 16 shows a trough between the peaks of the curve 15. The trough could be made smaller by using a higher value capacitor, as shown in FIG. 3, but this would delay the rise in the voltage across the capacitor.

Figure 4:
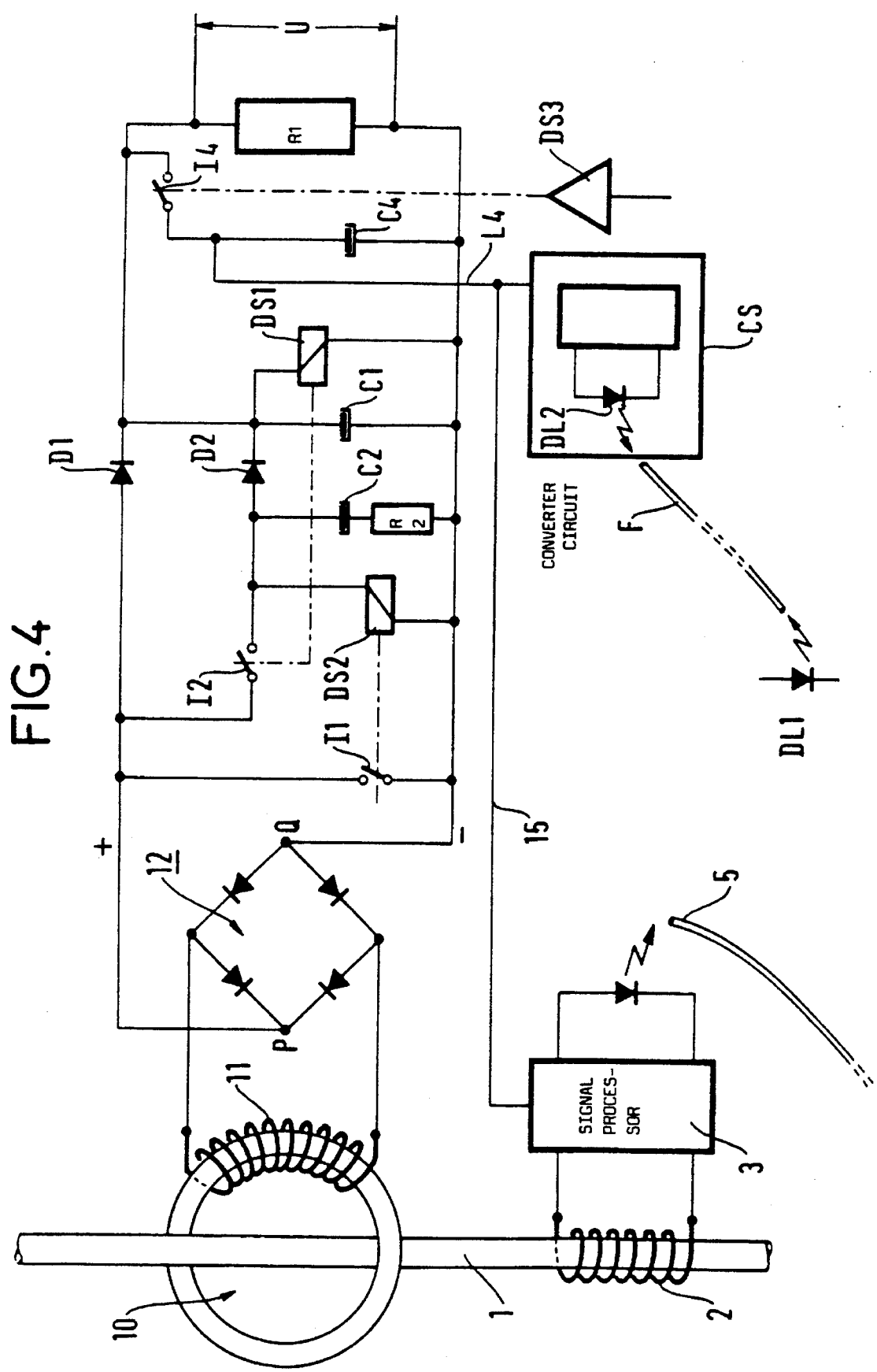
FIG. 4 is a circuit diagram of the electronic circuit power supply device of the invention.

FIG. 4 is a circuit diagram of a power supply device in accordance with the invention.

Components common to FIGS. 1 and 4 are identified by the same reference number.

The improvement to this circuit entails, firstly, connecting between the rectifier bridge outputs P and Q, i.e. between the branches marked + and − of the power supply circuit, a branch comprising a second capacitor C2 in series with an electronic switch I2 and a resistor R2; a diode D2 connects the positive ends of the capacitors C1 and C2. The switch I2 is controlled by a threshold detector DS1 shunting the capacitor C1 and the switch I1 is controlled by a threshold detector DS2 shunting the capacitor C2. The circuit works as follows:

Initially the capacitor C1 charges, switches I1 and I2 being open. When the voltage across the capacitor C1 reaches a predetermined threshold V1, as detected by the threshold detector DS1, the latter closes the switch I2; the capacitor C2 charges; when the voltage across C2 reaches a threshold V2 which is less than or equal to the threshold V1 and is detected by the detector DS2, the latter closes the switch I1. The current transformer is then short-circuited and the capacitor C1 discharges into the resistor R1 across which the power supply voltage U of the circuit 3 is obtained. Provided that the current output by the current transformer is greater than the current required by the load the cycle of charging and discharging the capacitor C1 continues between C1 and I1.

When this condition no longer applies, a voltage trough appears and is filled in by discharging the capacitor C2.

The problem of the rapid onset of the supply occurs when a line on which there is a fault becomes live. It is then necessary, with no delay (within less than one millisecond, for example) to supply the indication of the current ("current" indication) to the protection devices responsible for eliminating the fault.

The first improvement made by the invention concerns the current transformer.

A current transformer delivers to the secondary a current inversely proportional to the number of turns of the secondary winding.

If a current transformer is made with a small number of secondary turns, the current delivered to the secondary is high, which is desirable when the line becomes live, but this makes it very difficult to make the power supply resistant to overloads, or even able to withstand the continuous current.

Figure 5:
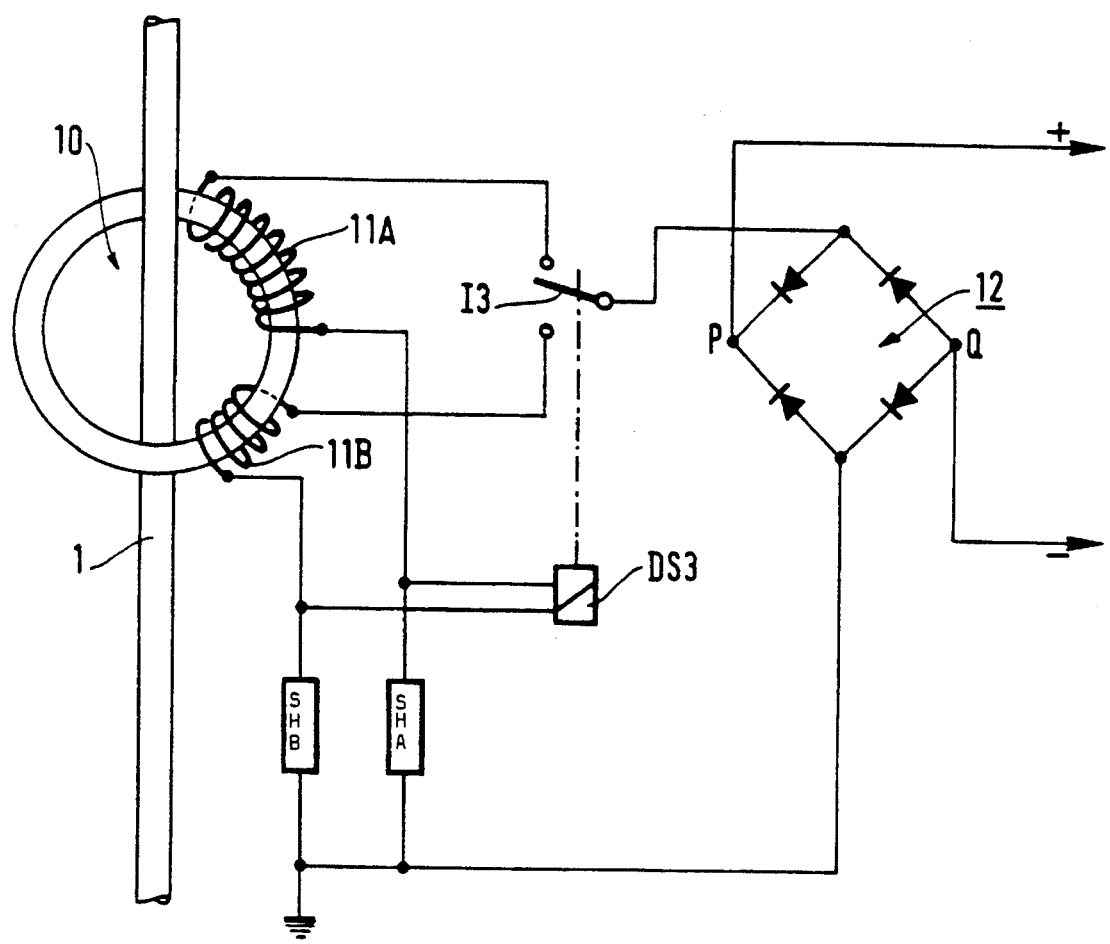
FIG. 5 is a diagram showing one specific embodiment of the current transformer equipping the power supply device of the invention.

The FIG. 5 circuit shows our first solution to this problem:

the secondary of the current transformer includes two windings 11A and 11B in series, with different numbers of turns; a switch I3 in series with both windings connects the appropriate winding to the rectifier bridge 12. In a first embodiment the switch I3 is controlled by a threshold detector which monitors the current flowing in the secondary. This detector DS3 receives the values of the currents in each winding, weighted by shunts SHA and SHB to allow for the number of turns in each of the windings 11A and 11B.

Alternatively, the switch I3 is controlled by the threshold detector DS2 previously described with reference to FIG. 4.

In another embodiment the power supply is provided in part by an optical fiber energized from the ground by a laser diode or a light-emitting diode, the luminous energy travelling up the fiber being converted into electrical energy by a photodiode and then converted to the required voltage by an electronic converter.

FIG. 4 shows one such embodiment.

The optical fiber F is supplied with luminous energy by a diode DL1; on the electrical line a converter circuit CS comprising a photodiode DL2 converts the light into an electric current. The converter can be a simple transformer followed by a rectifier if the light is pulsed, for example at 10 kHz. The electric current produced by the converter CS is transmitted to the + branch of the power supply circuit by means of a connection L4 in series with a control switch I4. A capacitor C4 connects the connection L4 to the − branch of the power supply circuit. The switch I4 is advantageously controlled by the current measurement circuit DS3 from FIG. 5. If the current becomes too low, as sensed by the detector DS3, the latter closes the switch I4 and the capacitor C4 supplies the necessary current.

The optical fiber can be used to send analog-to-digital synchronization instructions for the conversion processes, which must be simultaneous for current and voltage measurements on the three phases.

The "marker pulse" technique can be used, for example: a pulse is eliminated from the series of pulses travelling in the fiber F, the start of the conversion corresponding to the rising edge of the pulse following the missing pulse. The aforementioned information is conveyed between the converter CS and the converter 3 by a link 15.

If the line 1 is connected to a circuit-breaker which opens and then closes the current in the line is interrupted for a few tenths of second. To maintain the power supply during this period a high-value (1 000 µF, for example) capacitor C2 can be used in series with a resistor R2 for limiting the current to a value of 1 mA, for example. Thus the appearance of the power supply is not delayed. The charging time for the capacitor C2 is long, but this is of no consequence since the open/close cycle is assumed to occur a long time after the line becomes live.

There is claimed:

1. Device for supplying a power supply voltage to an electronic circuit, in particular to an electronic circuit associated with a current sensor for measuring the electrical current in a high-tension line, said device comprising a current transformer having a primary circuit and a secondary circuit, a rectifier bridge shunting the secondary circuit and output terminals of the rectifier bridge, a first capacitor in parallel with a first resistor across which said power supply voltage is obtained, a first switch being disposed between the output terminals of the rectifier bridge, said device comprising between the output terminals of the rectifier bridge a branch comprising in series a second capacitor, a second switch and a second resistor, the first switch being controlled by a first threshold detector shunting the second capacitor, the second switch being controlled by a second threshold detector shunting the first capacitor, the first and second threshold detectors respectively closing the first and second switches when predetermined first and second thresholds are respectively reached, said current transformer comprising two secondary windings having different numbers of turns and magnetically connected in series to the rectifier bridge through a controlled third switch.

2. Device according to claim 1 wherein said third switch is controlled by a third sensor receiving the current flowing through the secondary winding.

* * * * *